United States Patent
Seki

(10) Patent No.: US 8,319,197 B2
(45) Date of Patent: Nov. 27, 2012

(54) FREQUENCY ADJUSTING APPARATUS

(75) Inventor: Hitoshi Seki, Moriyama (JP)

(73) Assignee: Murata Manufacturing Co., Ltd. (JP)

( * ) Notice: Subject to any disclaimer, the term of this patent is extended or adjusted under 35 U.S.C. 154(b) by 710 days.

(21) Appl. No.: 12/487,635

(22) Filed: Jun. 18, 2009

(65) Prior Publication Data

US 2010/0018858 A1 Jan. 28, 2010

(30) Foreign Application Priority Data

Jul. 28, 2008 (JP) ................................. 2008-192950

(51) Int. Cl.
*G21K 5/10* (2006.01)
(52) U.S. Cl. ............. 250/492.22; 250/492.1; 250/492.2; 250/492.21; 250/492.3
(58) Field of Classification Search ............... 250/492.1, 250/492.2, 492.22, 492.3
See application file for complete search history.

(56) References Cited

U.S. PATENT DOCUMENTS

| 6,320,195 B1 * | 11/2001 | Magome | 250/442.11 |
| 2002/0176065 A1 * | 11/2002 | Pierrat | 355/77 |

FOREIGN PATENT DOCUMENTS

| JP | H04-160159 A | 6/1992 |
| JP | H08-227276 A | 9/1996 |
| JP | H10-173460 A | 6/1998 |
| JP | 2001-036370 A | 2/2001 |
| JP | 2002-026673 A | 1/2002 |
| JP | 2004-056455 A | 2/2004 |
| JP | 2007-228634 A | 9/2007 |

OTHER PUBLICATIONS

Berry et al., "Programmable aperture plate for maskless high-throughput nanolithography", Journal of Vacuum Science Technology B 15(6), Nov./Dec. 1997, 2382-2387.*
Japanese Office Action "Notification of Reasons for Rejection" with mailing date of May 11, 2010; Japanese Patent Application No. 2008-192950; with English translation.

* cited by examiner

*Primary Examiner* — David A Vanore
*Assistant Examiner* — Nicole Ippolito
(74) *Attorney, Agent, or Firm* — Studebaker & Brackett PC; Tim L. Brackett, Jr.; John F. Guay

(57) ABSTRACT

A wafer having a plurality of elements closely arranged thereon is irradiated with an ion beam while being conveyed in one direction by a conveying unit. Each of shutters adjusts an irradiation time during which a target area of the wafer is irradiated with the ion beam. Thus, a frequency in the target area is adjusted. Each of a plurality of mask holes in a pattern mask disposed between the wafer and the shutters corresponds to one area of the wafer. The mask holes are alternately displaced in a wafer conveying direction in which the wafer is conveyed, and are arranged in a plurality of columns perpendicular to the wafer conveying direction. To individually open and close the mask holes, the shutters are arranged to correspond to the respective mask holes. Thus, frequency adjustment, for areas in one column perpendicular to the wafer conveying direction, is performed in multiple steps.

16 Claims, 9 Drawing Sheets

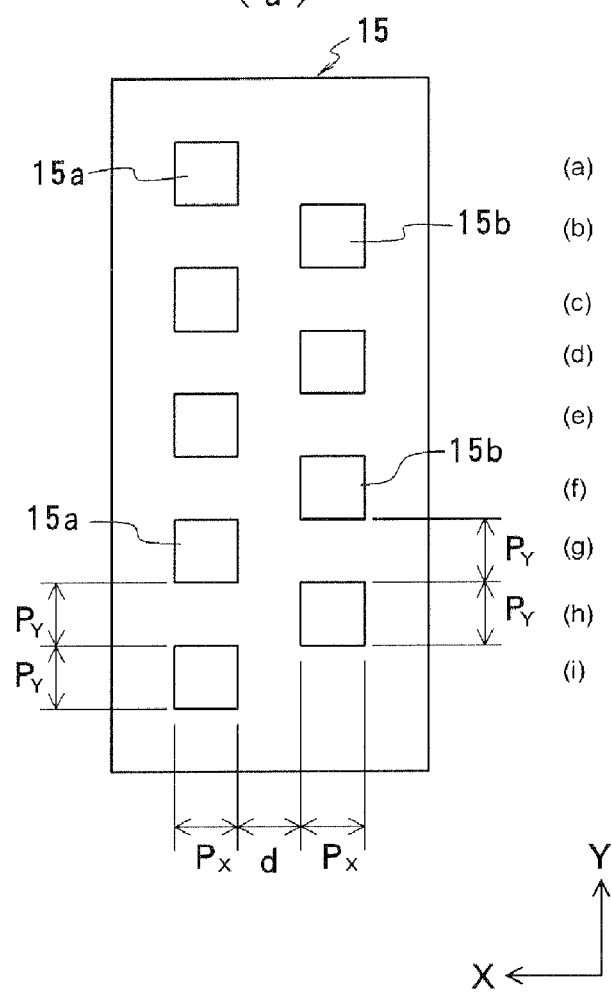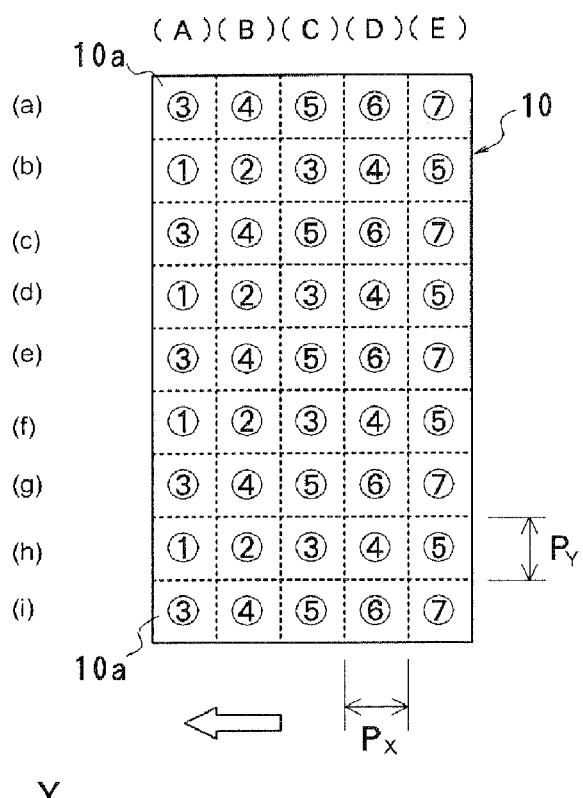

WAFER CONVEYING DIRECTION

CONVEYING DIRECTION

FIG. 7B
(b)
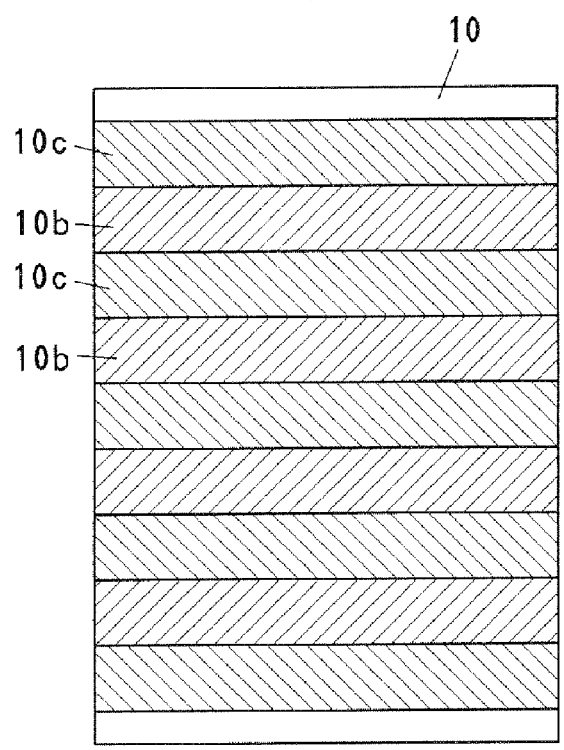
FIG. 7A
(a)
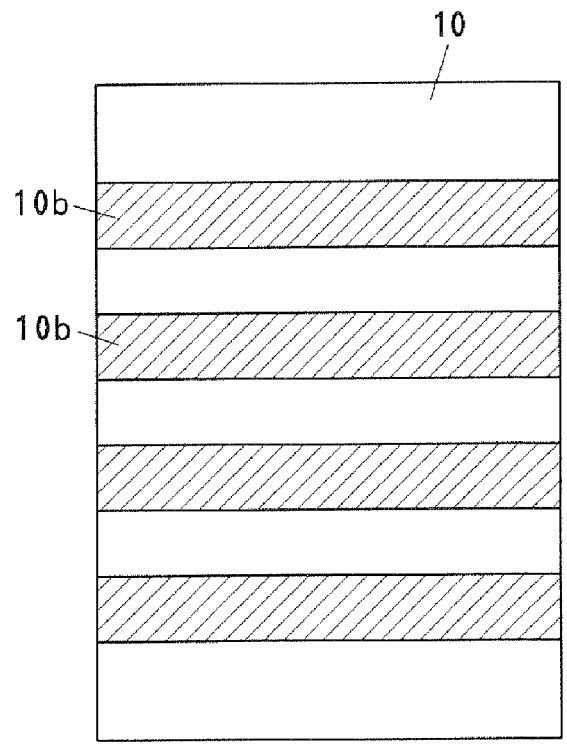
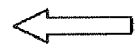
CONVEYING DIRECTION

WAFER CONVEYING DIRECTION

PRIOR ART

FIG. 9A
(a)
ION BEAM
FIG. 9B
(b)
ION BEAM
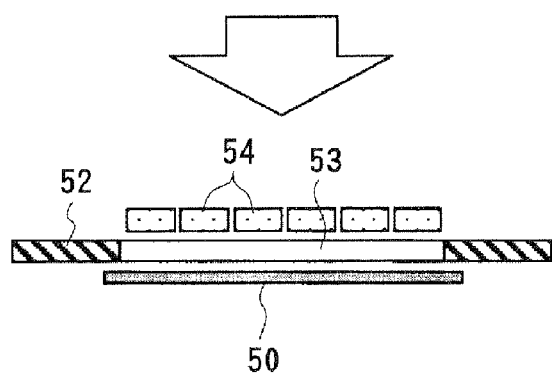
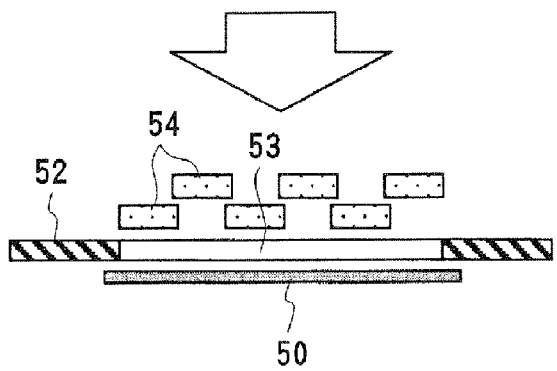
PRIOR ART

ID ADJUSTING APPARATUS

FREQUENCY ADJUSTING APPARATUS

CROSS REFERENCE TO RELATED APPLICATIONS

The present application claims priority to Japanese Patent Application No. JP2008-192950 filed Jul. 28, 2008, the entire contents of this application being incorporated herein by reference in their entirety.

BACKGROUND OF THE INVENTION

1. Field of the Invention

The present invention relates to apparatuses capable of performing frequency adjustment by etching elements formed on a wafer, or relates to apparatuses capable of performing frequency adjustment by applying a frequency adjusting material to elements formed on a wafer.

2. Description of the Related Art

In a conventional frequency adjusting method, the frequency of a piezoelectric element is adjusted by etching the piezoelectric element with an ion beam. To achieve higher productivity in using this method, a plurality of elements are formed or arranged on a wafer so that the frequencies of the plurality of elements can be adjusted at the same time. In this frequency adjusting method, to prevent the wafer other than areas of desired elements from being irradiated with the ion beam, it is necessary that the wafer be masked with a pattern mask. However, when each element is small in size, it is difficult to selectively apply the ion beam only to a desired element. Therefore, a plurality of elements may be grouped together as a single irradiation area to be irradiated.

When such small elements are closely arranged on the wafer, it is necessary to apply the ion beam uniformly to the entire surface of the wafer. However, depending on the size or shape of a hole in the pattern mask, areas adjacent to an irradiation target area may be irradiated with the ion beam, or the edge of the irradiation target area may not be sufficiently irradiated with the ion beam.

Japanese Unexamined Patent Application Publication No. 2002-26673 discloses a frequency adjusting method in which the frequency of each piezoelectric element is adjusted by applying an ion beam to a plurality of electrodes formed on a surface of a piezoelectric substrate, and thereby etching the electrodes. This method involves determining a correlation between an ion-beam irradiation time and the amount of frequency change, measuring the frequency of each element on the piezoelectric substrate, determining the amount of frequency adjustment for each element on the basis of a difference between the measured frequency and a target value, determining the ion-beam irradiation time for each element on the basis of the determined amount of frequency adjustment by using the correlation, and applying an ion beam to each element during the determined irradiation time.

Japanese Unexamined Patent Application Publication No. 2004-56455 discloses a frequency adjusting apparatus capable of adjusting the frequencies of piezoelectric elements by performing ion beam etching in a vacuum chamber. The frequency adjusting apparatus includes a piezoelectric substrate having a plurality of electrodes formed on its surface; a base plate having an opening for selectively allowing the plurality of electrodes on the piezoelectric substrate to be exposed; an ion source configured to apply an ion beam simultaneously to the plurality of electrodes exposed from the opening in the base plate; a protective plate configured to protect, from being etched, a region around the opening in the base plate to which the ion beam is applied; shutter mechanisms provided as many as the number of the electrodes exposed from the opening in the base plate, and capable of being independently driven; and a masking plate for blocking the ion beam leaking through gaps between the shutter mechanisms.

Additionally, as illustrated in FIG. 8, FIG. 9A, and FIG. 9B, there is a conventional frequency adjusting apparatus capable of simultaneously adjusting the frequencies of a plurality of elements arranged perpendicularly to a wafer conveying direction. In this apparatus, a wafer 50, on which a plurality of elements 51 are arranged in a matrix, is conveyed by a conveying unit (not shown) in a wafer conveying direction indicated by an arrow, as shown in FIG. 8. The wafer 50 passes under a pattern mask 52 having a mask hole 53. The mask hole 53 is a slit-like (i.e., elongated) hole allowing a column of elements arranged perpendicularly to the conveying direction of the wafer 50 to be exposed. A plurality of shutters 54 (e.g., six shutters 54 in FIG. 8) are arranged on the pattern mask 52. Each of the shutters 54 is independently actuated with respect to the mask hole 53 in the wafer conveying direction. By selectively covering the slit-like mask hole 53 with the plurality of shutters 54, an irradiation time during which each of the elements 51 is irradiated with an ion beam can be adjusted.

In the case of Japanese Unexamined Patent Application Publication No. 2002-26673, a pattern mask having mask holes corresponding to the respective positions of the electrodes is disposed on the piezoelectric substrate. These mask holes are spaced apart from each other, and the ion beam cannot be applied to regions where there are no mask holes. Therefore, this pattern mask is not suitable for use in irradiating small elements closely arranged on the piezoelectric substrate. Additionally, since a rotatable disk-shaped shutter having a double-layered structure is used, it takes time to change the shutter position. Moreover, since the shutter may pass through an opening during rotation, the accuracy of frequency adjustment may be degraded.

In the case of the frequency adjusting apparatus disclosed in Japanese Unexamined Patent Application Publication No. 2004-56455, the ion beam is blocked by the masking plate disposed directly above a wafer. However, the shape of holes in this masking plate is not suitable for processing small elements arranged closely on the wafer, as in the case of Japanese Unexamined Patent Application Publication No. 2002-26673 described above.

In the case of the apparatus illustrated in FIG. 8, the shutters 54 for covering the slit-like mask hole 53 may be arranged side by side with gaps between adjacent ones, as shown in FIG. 9A, or stacked in a vertical direction, as shown in FIG. 9B. In the case of FIG. 9A, the ion beam enters through the gaps between adjacent shutters 54. This may cause adjustment errors when the elements 51 are closely arranged on the wafer 50. In the case of FIG. 9B, since a masking shape is determined not only by the pattern mask 52 but also by the adjacent shutters 54, a masking position (i.e., distance from the wafer 50) is not constant. Since the ion beam tends to spread out, a change in masking position may cause a change in the amount of spreading of the ion beam. As a result, the amount of etching in adjacent areas or the amount of etching at the edge of a target area may be reduced.

SUMMARY OF THE INVENTION

Accordingly, it is an object of the present invention to provide a frequency adjusting apparatus capable of dealing with a wafer having many elements closely arranged thereon, and capable of simultaneously and accurately adjusting the frequencies of a plurality of elements on the wafer while keeping an ion-beam masking position (i.e., distance from the wafer) constant.

To achieve the object described above, according to preferred embodiments of the present invention, a frequency adjusting apparatus includes a conveying unit configured to convey, in one direction, a wafer on which a plurality of elements are closely arranged; an ion gun for etching, the ion gun being configured to irradiates the wafer with an ion beam while the wafer is being conveyed; a pattern mask having a plurality of mask holes allowing only target areas of the wafer to be exposed, the pattern mask being disposed upstream of the wafer in a direction in which the ion beam travels; and a plurality of shutters each being configured to adjust an irradiation time during which a target area is irradiated with the ion beam, and thereby adjust a frequency in the target area. Each of the mask holes in the pattern mask corresponds to one area of the wafer.

The mask holes are alternately displaced in a wafer conveying direction in which the wafer is conveyed, and are arranged in a plurality of columns perpendicular to the wafer conveying direction. The shutters are arranged to correspond to the respective mask holes to individually open and close the corresponding mask holes. Frequency adjustment for areas in one column perpendicular to the wafer conveying direction is performed in multiple steps.

According to preferred embodiments of the present invention, a frequency adjusting apparatus includes a conveying unit configured to convey, in one direction, a wafer on which a plurality of elements are closely arranged; a frequency-adjusting-material applying unit configured to apply a frequency adjusting material to the wafer while the wafer is being conveyed; a pattern mask having a plurality of mask holes allowing only target areas of the wafer to be exposed, the pattern mask being disposed upstream of the wafer in a direction in which the frequency adjusting material is applied; and a plurality of shutters each being configured to adjust an application time during which the frequency adjusting material is applied to a target area, and thereby adjust a frequency in the target area.

Each of the mask holes in the pattern mask corresponds to one area of the wafer. The mask holes are alternately displaced in a wafer conveying direction in which the wafer is conveyed, and are arranged in a plurality of columns perpendicular to the wafer conveying direction. The shutters are arranged to correspond to the respective mask holes to individually open and close the corresponding mask holes. Frequency adjustment for areas in one column perpendicular to the wafer conveying direction is performed in multiple steps.

A description of the frequency adjustment performed using the ion beam in the present invention is provided below.

As described above, each of the mask holes in the pattern mask corresponds to one area of the wafer. Since the mask holes are arranged such that processing for areas in one column perpendicular to the wafer conveying direction is performed in multiple steps, the ion beam can be blocked at the same distance from the wafer in both the X and Y directions. Thus, the effect of spreading of the ion beam on the wafer is substantially the same in both the X and Y directions. Therefore, it is possible to minimize reduction in the amount of etching in adjacent areas and the amount of etching at the edge of a target area. Since etching can be made uniformly throughout the entire surface of the wafer, it is possible to realize frequency adjustment for small elements, or areas, closely arranged on the wafer.

Although one area (e.g., one mask hole) may correspond to one element, higher processing efficiency can be achieved if one area includes a plurality of elements. An optimum area size can be determined on the basis of the balance between the processing efficiency and the level of accuracy necessary for frequency adjustment. When many elements are formed on one wafer, and since a plurality of neighboring elements are substantially the same in terms of variations in frequency, frequency adjustment may be made by applying the same amount of ion beam thereto.

The conveying unit intermittently conveys the wafer at a pitch of one area of the wafer. The mask holes of the pattern mask may preferably be alternately displaced in the wafer conveying direction by a distance of one or more elements and arranged in two columns perpendicular to the wafer conveying direction. Thus, by causing the wafer to pass relative to the pattern mask, all the elements or areas may be uniformly adjusted.

Additionally, since the shutters are spaced apart in a direction perpendicular to the wafer conveying direction, the dimensions of each shutter can be set such that one mask hole can be completely closed. This may solve the problem of leakage of the ion beam. It may be more preferable that the mask holes of the pattern mask be alternately displaced in the wafer conveying direction by a distance of one or more pitches and arranged in two columns perpendicular to the wafer conveying direction. This may facilitate the arrangement of areas and data processing.

The shutters may be preferably divided into a first shutter group for closing the mask holes in a first column perpendicular to the wafer conveying direction and a second shutter group for closing the mask holes in a second column perpendicular to the wafer conveying direction. First actuators configured to drive the first shutter group and second actuators configured to drive the second shutter group may be preferably arranged opposite each other on both sides of the pattern mask in the wafer conveying direction. Although the first shutter group and the second shutter group may be arranged on the same side of the pattern mask, this arrangement may cause interference between adjacent shutters or actuators. When the first and second actuators are arranged on both sides of the pattern mask, it is possible to properly open and close the mask holes while preventing adjacent shutters and adjacent actuators from interfering with each other.

In the embodiments described above, each element is formed in advance such that its frequency is lower than a target value. Subsequently, according to the measured frequency of the element, a target area of the wafer may be etched by ion-beam irradiation so that frequency adjustment can be made.

On the other hand, each element may be formed in advance such that its frequency is higher than a target value. Subsequently, according to the measured frequency of the element, a frequency adjusting material may be applied to a target area.

Alternatively, after measurement of the frequency of each element, elements whose measured frequencies are lower than a target value may be etched with an ion beam, while a frequency adjusting material may be applied to elements whose measured frequencies are higher than the target value. The level of frequency adjustment made by etching or application of the frequency adjusting material may vary depending on the structure of the element. That is, any level of frequency adjustment may be made, as long as a frequency that is shifted in advance can be brought closer to the target value.

Thus, according to the preferred embodiments of the present invention, it is possible to minimize gaps or overlaps between adjacent areas so that the entire surface of the wafer can be irradiated with the ion beam. Even when small elements are closely arranged on the wafer, frequency adjustment can be made uniformly regardless the position (i.e., either at the center or edge) in each area. Additionally, since processing for a column of areas arranged perpendicularly to the wafer conveying direction is performed in multiple steps, frequency adjustment for the entire surface of the wafer can be efficiently made by moving the wafer in one direction.

Also, according to the preferred embodiments of the present invention, it is possible to minimize gaps or overlaps between adjacent areas so that the frequency adjusting material can be applied to the entire surface of the wafer. Even when small elements are closely arranged on the wafer, frequency adjustment can be made uniformly regardless the position (i.e., either at the center or edge) in each area. Additionally, since processing for a column of areas arranged perpendicularly to the wafer conveying direction is performed in multiple steps, frequency adjustment for the entire surface of the wafer can be efficiently made by moving the wafer in one direction.

Other features, elements, characteristics and advantages of the present invention will become more apparent from the following detailed description of preferred embodiments of the present invention with reference to the attached drawings.

BRIEF DESCRIPTION OF THE DRAWINGS

FIG. 3A and FIG. 3B are plan views illustrating a relationship between a pattern mask and a wafer.

FIG. 7A and FIG. 7B illustrate a wafer to show how frequency adjustment is performed in the third embodiment of FIG. 6.

FIG. 9A and FIG. 9B are cross-sectional views taken along line IX-IX of FIG. 8.

DESCRIPTION OF THE PREFERRED EMBODIMENTS

Preferred embodiments of the present invention will now be described.
First Embodiment FIG. 1 to FIG. 4 illustrate an example of a frequency adjusting apparatus according to an embodiment of the present invention. A frequency adjusting apparatus 1 includes an enclosed processing chamber 2 and a vacuum pump 4 connected to one side of the processing chamber 2, with an opening/closing door 3 interposed between the processing chamber 2 and the vacuum pump 4. By driving the vacuum pump 4, the degree of vacuum in the processing chamber 2 can be maintained at a predetermined level.

Figure 1:
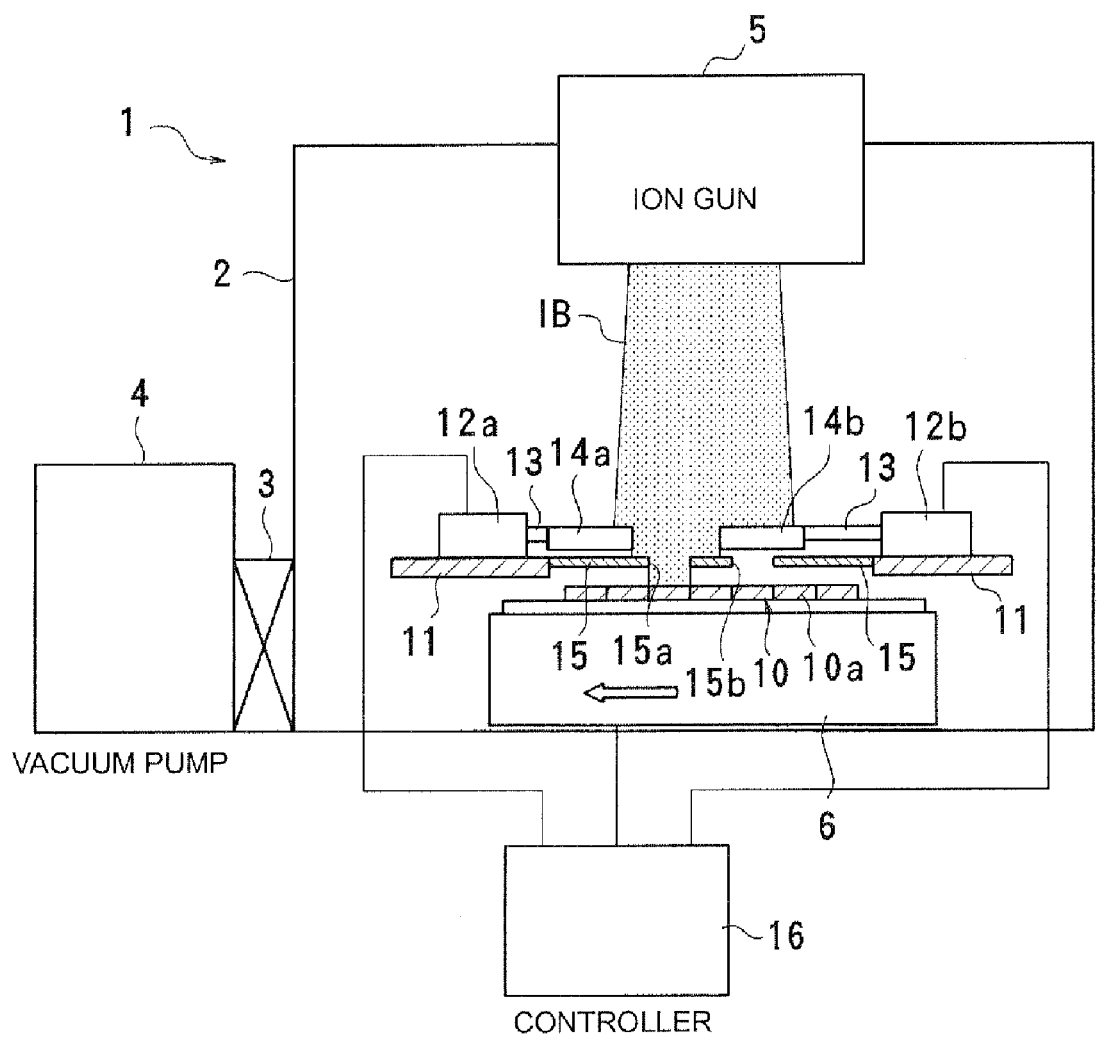
FIG. 1 is a schematic view of a frequency adjusting apparatus according to an embodiment of the present invention.

An ion gun 5 for etching is disposed at the ceiling of the processing chamber 2. As illustrated in FIG. 1, the ion gun 5 is capable of emitting an ion beam IB downward at a substantially constant intensity per unit area within a predetermined region.

Figure 2:
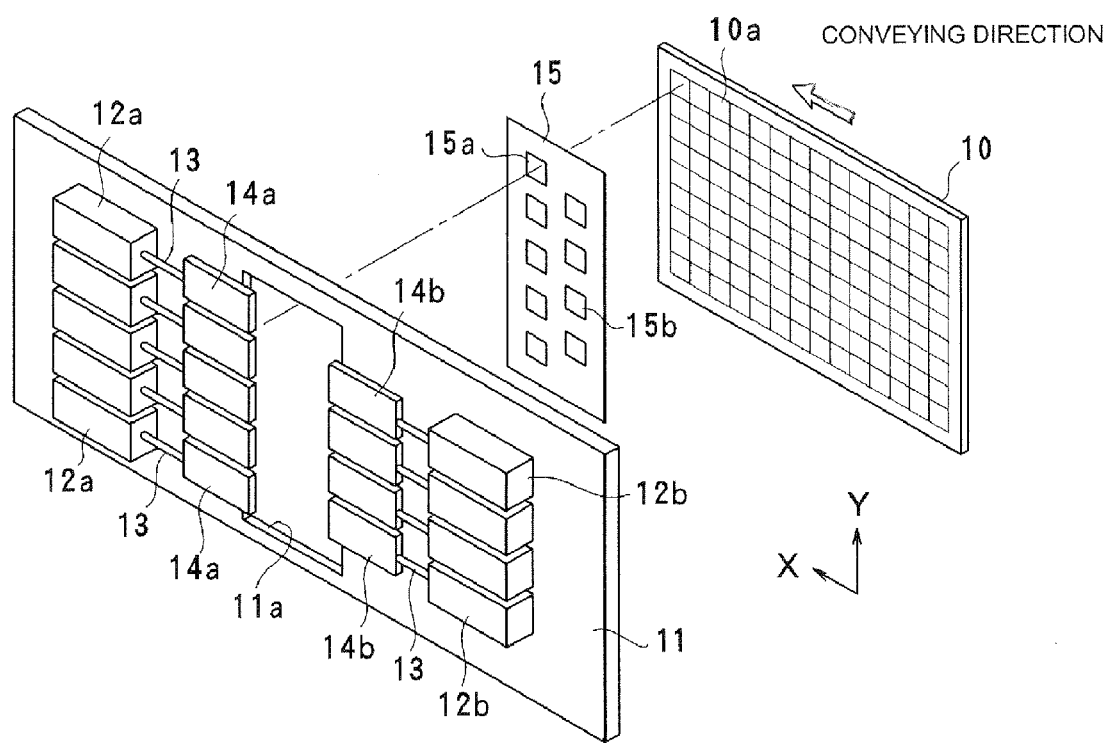
FIG. 2 is an exploded perspective view illustrating a main part of the frequency adjusting apparatus as viewed from an ion gun of FIG. 1.

A movable stage (i.e., conveying unit) 6 is disposed at the bottom of the processing chamber 2. A wafer 10, such as a piezoelectric substrate, is positioned and held on the movable stage 6. As illustrated in FIG. 2 and FIG. 3B, areas 10a, each including a plurality of elements grouped together as a single unit, are closely arranged on the wafer 10 in a matrix at a constant pitch P. The movable stage 6 is capable of intermittently conveying the wafer 10 in the direction of arrow at the pitch P of one area 10a. Before the wafer 10 is conveyed to the frequency adjusting apparatus 1, a frequency in each area 10a of the wafer 10 is shifted in advance in a direction opposite a direction in which the frequency is changed by ion beam irradiation. Then, the frequency in each area 10a is adjusted to be closer to a target value by ion beam irradiation. A layer formed on the wafer 10 and etched by ion beam irradiation may be an electrode layer, a protective layer, or a layer of any material, as long as frequency adjustment can be made. The frequency in each area 10a of the wafer 10 is measured in advance, so that the amount of frequency shift relative to the target value is determined.

A shutter base 11 is horizontally disposed at a given position above the movable stage 6. The shutter base 11 has an opening 11a at the center thereof. The size of the opening 11a substantially corresponds to that of a region to be irradiated with the ion beam by the ion gun 5. A pattern mask 15 is positioned and secured in the opening 11a of the shutter base 11. The pattern mask 15 protects a specific region of the wafer 10, except target areas, from being irradiated with the ion beam. It is preferable that the pattern mask 15 be supported at a position as close as possible to the wafer 10.

As illustrated in FIG. 3A, the pattern mask 15 is provided with a plurality of mask holes 15a and 15b each corresponding to one area 10a of the wafer 10. The size of each of the mask holes 15a and 15b is determined according to the distance between the pattern mask 15 and the wafer 10 and the spreading angle of the ion beam, and is set to be substantially the same as the size of each area 10a.

To perform processing for one column of the wafer 10 in two steps, the mask holes 15a and 15b are alternately displaced in a wafer conveying direction (i.e., X direction) and thus arranged in two columns in a direction (i.e., Y direction) perpendicular to the wafer conveying direction. That is, the mask holes 15a in odd-numbered rows and the mask holes 15b in even-numbered rows are displaced from each other in the X direction (i.e., conveying direction).

For example, as illustrated in FIG. 3B, when the areas 10a of the wafer 10 are arranged in nine rows (a) to (i), the mask holes 15a on the downstream side (i.e., left side) in the conveying direction correspond to the respective areas 10a in odd-numbered rows (a), (c), (e), (g), and (i), while the mask holes 15b on the upstream side (i.e., right side) in the conveying direction correspond to the respective areas 10a in even-numbered rows (b), (d), (f), and (h).

The two columns of the mask holes 15a and 15b are spaced from each other in the X direction by a distance d corresponding to one column of the areas 10a. The distance d between the two columns of the mask holes 15a and 15b may correspond to one column (i.e., one area pitch=$P_x$, $P_y$) or a plurality of columns of the areas 10a, depending on the distance of one area pitch or the like.

Figure 4:
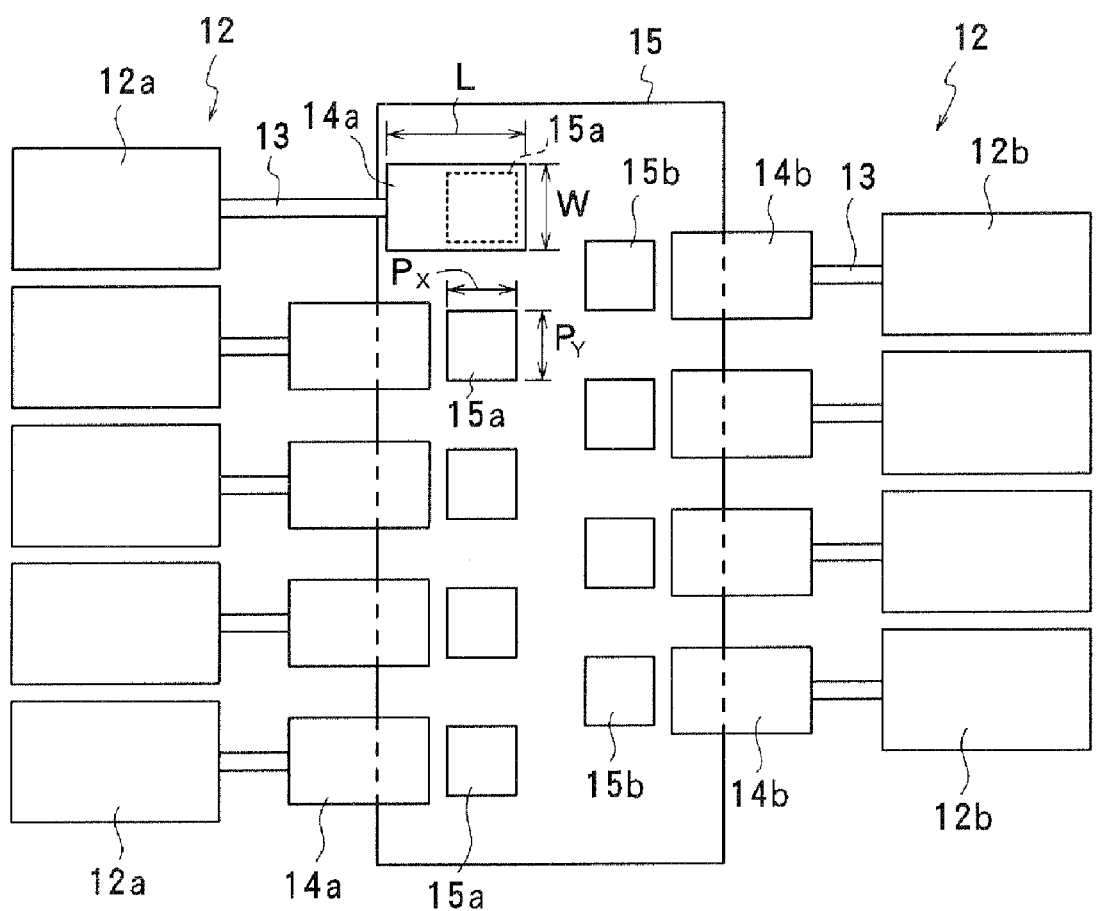
FIG. 4 is a plan view illustrating a relationship between the pattern mask and shutters.

As illustrated in FIG. 2, a plurality of actuators 12a and 12b are secured to the shutter base 11, with the opening 11a positioned between the actuators 12a and 12b. As illustrated in FIG. 4, shutters 14a are connected to the respective actuators 12a via respective rods 13, while shutters 14b are connected to the respective actuators 12b via respective rods 13.

The shutters 14a and 14b are horizontally actuated individually by the respective actuators 12a and 12b. It is desirable that the actuators 12a and 12b be linear actuators, such as solenoids or voice coil motors, capable of moving between two positions at high speed. The shutters 14a and 14b correspond to the mask holes 15a and 15b, respectively, so as to individually open and close the corresponding mask holes 15a and 15b. That is, the shutters 14a on the left side and the shutter 14b on the right side in FIG. 4 are actuated in opposite directions, so that the shutters 14a open and close the mask holes 15a on the left side and the shutters 14b open and close the mask holes 15b on the right side. It is preferable that the shutters 14a and 14b be moved at a position as close as possible to the upper surface of the pattern mask 15.

To completely cover each of the mask holes 15a and 15b, a length L and a width W of each of the shutters 14a and 14b are made greater than their corresponding dimensions $P_x$ and $P_y$, respectively, of each of the mask holes 15a and 15b. In the example of FIG. 4, only the upper left actuator 12a is actuated, so that the upper left shutter 14a closes the upper left mask hole 15a.

A controller 16, as shown in FIG. 1, controls the movement of the movable stage 6 and each of the actuators 12a and 12b such that frequency adjustment for the areas 10a in each column perpendicular to the wafer conveying direction is performed in multiple steps. For each area 10a of the wafer 10, the amount of frequency shift relative to a target value is stored in the controller 16 in association with an irradiation time during which the area 10a is to be irradiated with the ion beam.

After the wafer 10 is conveyed to a position below the pattern mask 15, all the shutters 14a and 14b are opened, so that all the areas 10a corresponding to the mask holes 15a and 15b are irradiated with the ion beam through the mask holes 15a and 15b. Then, the shutters 14a and 14b are closed sequentially in order from the one corresponding to the area 10a for which a desired irradiation time (i.e., irradiation time corresponding to the amount of frequency shift) elapses. After all the shutters 14a and 14b are closed, the wafer 10 is conveyed by a distance of one pitch in the conveying direction.

Next, referring to FIGS. 3A and 3B, the order of exposure of the areas 10a from the corresponding mask holes 15a and 15b, i.e., the order of ion beam irradiation, will be described. In FIG. 3B, each of circled numbers 1 to 7 in the respective areas 10a indicates the order of exposure.

When the leading end (i.e., left end) of the wafer 10 is brought to a position below the pattern mask 15, four areas 10a at A-b, A-d, A-f, and A-h are firstly exposed from the corresponding mask holes 15b on the right side. Thus, the four areas 10a exposed from the four corresponding mask holes 15b are irradiated with the ion beam, and the irradiation time for each of the four areas 10a is adjusted by the corresponding shutter 14b.

After all the shutters 14b are closed, the wafer 10 is conveyed by a distance of one pitch in the conveying direction. Then, four areas 10a at B-b, B-d, B-f, and B-h are secondly exposed from the corresponding mask holes 15b on the right side. At this point, since the wafer 10 has not yet reached the mask holes 15a on the left side, none of the areas 10a is exposed from the mask holes 15a on the left side. The four areas 10a exposed from the four corresponding mask holes 15b on the right side are irradiated with the ion beam, and the irradiation time for each of the four areas 10a is adjusted by the corresponding shutter 14b.

After all the shutters 14b are closed, the wafer 10 is conveyed by a distance of one pitch in the conveying direction. Then, thirdly, five areas 10a at A-a, A-c, A-e, A-g, and A-i are exposed from the corresponding mask holes 15a on the left side, while four areas 10a at C-b, C-d, C-f, and C-h are exposed from the corresponding mask holes 15b on the right side. The areas 10a exposed from the corresponding mask holes 15a and 15b are irradiated with the ion beam, and the irradiation time for each of the nine areas 10a is adjusted by the corresponding shutter 14a or 14b.

The subsequent operations, which are basically the same as that of the third operation described above, will not be described to avoid redundancy.

As described above, the pattern mask 15 is provided with the mask holes 15a and 15b, each corresponding to one area 10a, so that frequency adjustment for the areas 10a in one column perpendicular to the wafer conveying direction can be performed in multiple steps. Accordingly, even when the areas 10a are closely arranged, the entire wafer 10 can be uniformly irradiated with the ion beam.

Additionally, the mask holes 15a and 15b can be individually opened and closed by the corresponding shutters 14a and 14b, and the masking height (i.e., distance from the wafer 10) can be kept constant. Therefore, it is less likely that areas adjacent to target areas will be irradiated with the ion beam. At the same time, it is possible to solve the problem where the edge of each target area is not sufficiently irradiated with the ion beam.

Second Embodiment

Figure 5:
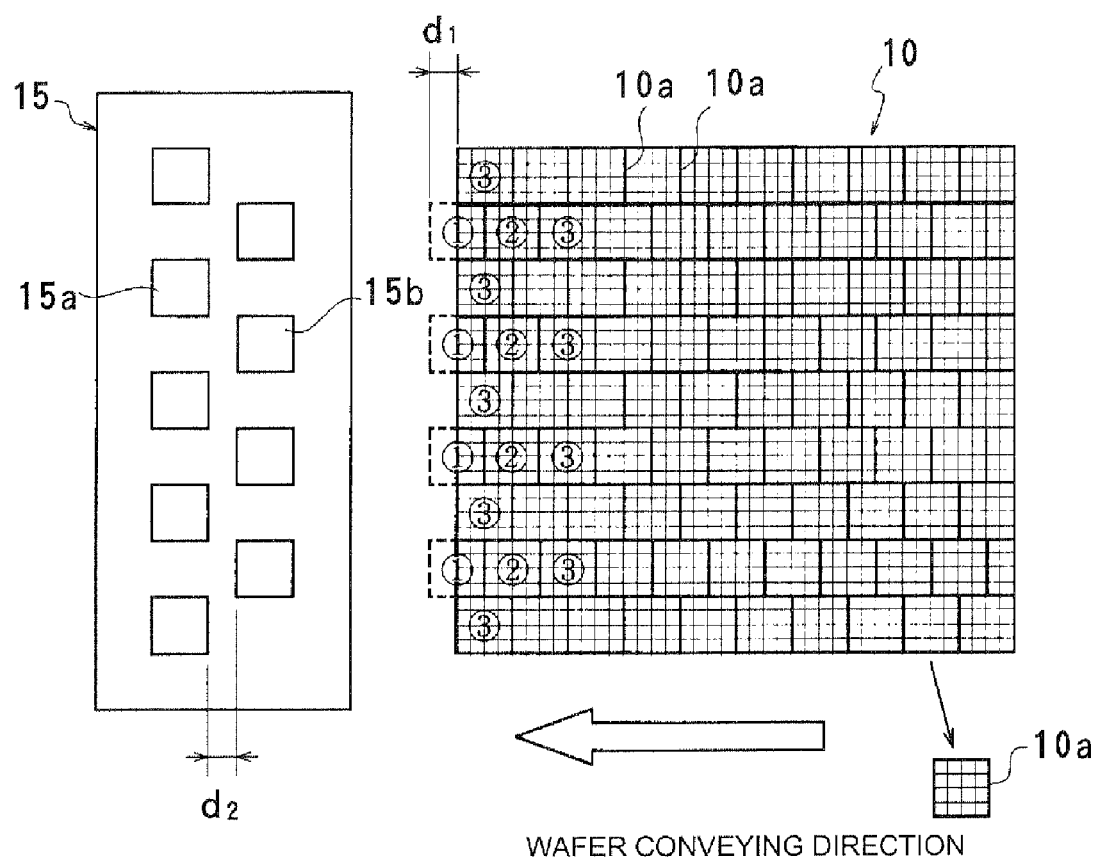
FIG. 5 is a plan view illustrating a relationship between a pattern mask and a wafer according to a second embodiment of the present invention.

FIG. 5 illustrates a frequency adjusting apparatus according to a second embodiment of the present invention. In the present embodiment, one area 10a of the wafer 10 includes an array of four by four elements. The areas 10a are displaced, on a row-by-row basis, by a distance of half a pitch corresponding to two elements in the conveying direction. That is, the areas 10a in the even-numbered rows are displaced in the conveying direction by a distance of half a pitch from the areas 10a in the odd-numbered rows.

The amount of displacement $d_1$, however, is not limited to a distance of half a pitch that corresponds to two elements. In the pattern mask 15, a column of the mask holes 15a and a column of the mask holes 15b are spaced from each other in the conveying direction of the wafer 10 by a distance $d_2$ smaller than one pitch P. The distance $d_2$, which is equal to the amount of displacement $d_1$ in the present embodiment, may be set to a value determined by the following equation: $d_2 = n \times P + d_1$ (n=1, 2, or the like)

The wafer 10 is intermittently conveyed relative to the pattern mask 15 in a direction of arrow at a pitch of one area 10a. Each of circled numbers 1 to 3 in the respective areas 10a indicates the order of exposure. First, two columns of elements in each area marked with a circled number 1 are exposed from the corresponding mask hole 15b on the upstream side and frequency-adjusted. Next, the areas 10a marked with a circled number 2 are exposed from the corresponding mask holes 15b and frequency-adjusted. Then, the areas 10a marked with a circled number 3 are exposed from the corresponding mask holes 15a and 15b and frequency-adjusted. Likewise, the areas 10a corresponding to the mask holes 15a and 15b are sequentially frequency-adjusted.

The distance $d_2$ between the columns of the mask holes 15a and 15b may correspond to one column of elements, three columns of elements, or the like. That is, the distance $d_2$ may be determined on an element column by element column basis, depending on the arrangement of the areas 10a.

Third Embodiment

Figure 6:
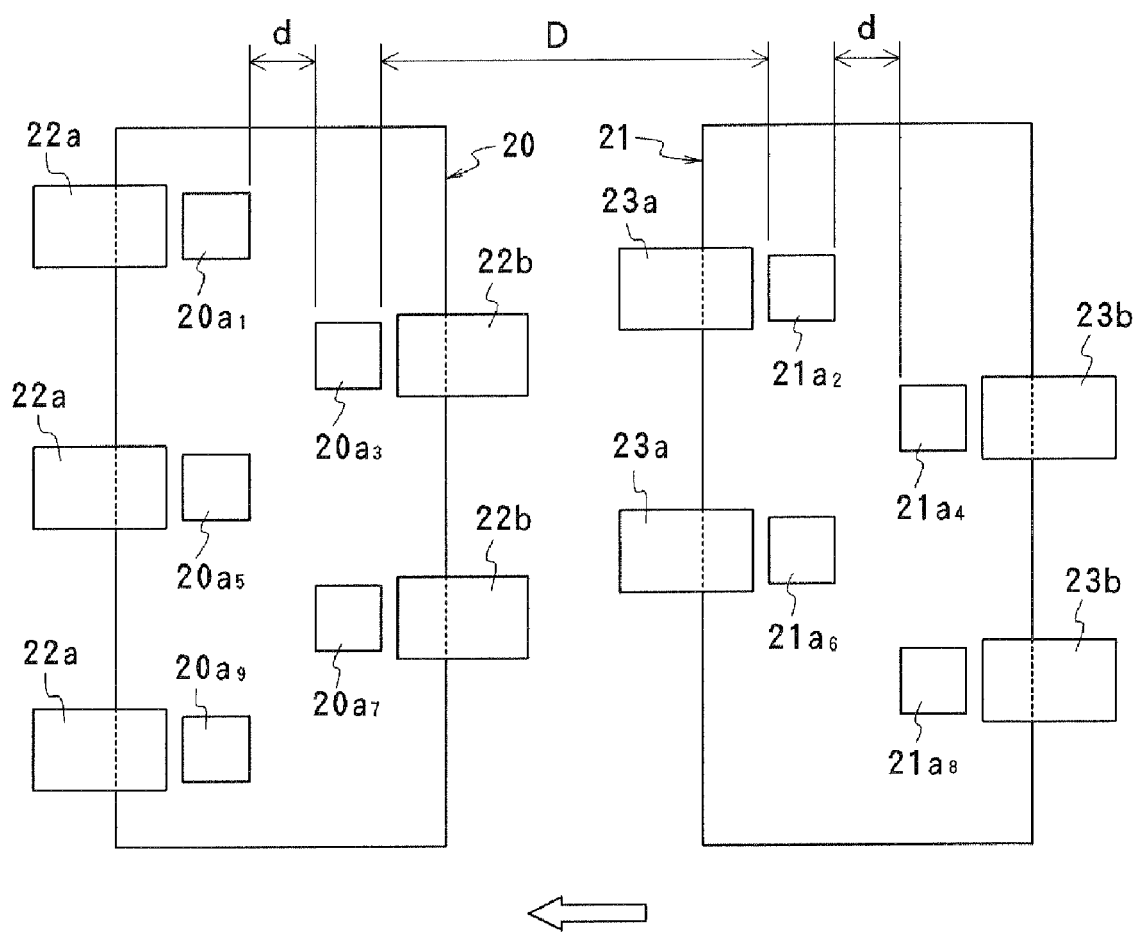
FIG. 6 is a plan view illustrating a relationship between a pattern mask and shutters according to a third embodiment of the present invention.
Figure 8:
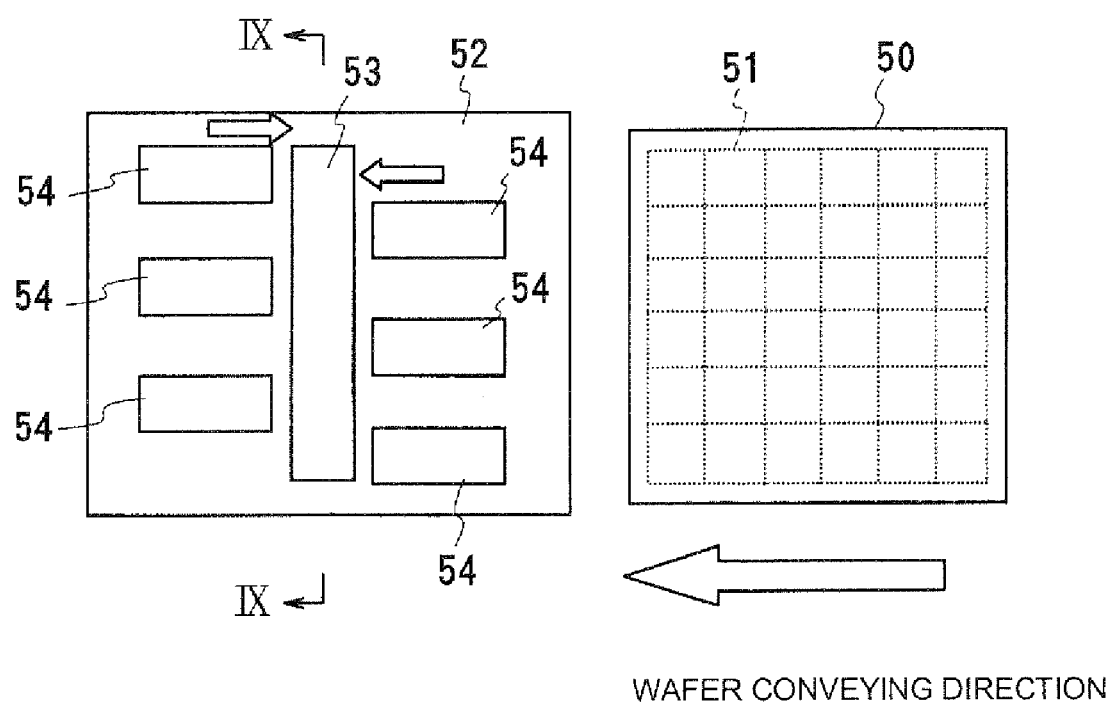
FIG. 8 is a schematic plan view illustrating a frequency adjusting apparatus according to a related art.

FIG. 6 illustrates a frequency adjusting apparatus according to a third embodiment of the present invention. In the present embodiment, each of a plurality of pattern masks 20 and 21 is used to process areas only in specific rows. Thus, frequency adjustment for areas in each column perpendicular to the wafer conveying direction is performed in multiple steps. The two pattern masks 20 and 21 are spaced from each other by a predetermined distance D in the wafer conveying direction. It is preferable that the distance D be an integral multiple of the area pitch P.

The pattern mask 20 is provided with mask holes $20a_1$, $20a_3$, $20a_5$, $20a_7$, and $20a_9$ arranged in a staggered manner. The mask holes $20a_1$, $20a_3$, $20a_5$, $20a_7$, and $20a_9$ correspond to areas in respective odd-numbered rows (i.e., the first, third, fifth, seventh, and ninth rows). Specifically, the mask holes $20a_1$, $20a_5$, and $20a_9$ in the first, fifth, and ninth rows, respectively, are formed in the same column. This column is spaced from the other column of the mask holes $20a_3$ and $20a_7$ in the third and seventh rows, respectively, in the conveying direction (X direction) by a distance d corresponding to one or several columns.

The mask holes $20a_1$, $20a_5$, and $20a_9$ are individually opened and closed by corresponding shutters 22a arranged on the left side of the pattern mask 20. The mask holes $20a_3$ and $20a_7$ are individually opened and closed by corresponding shutters 22b arranged on the right side of the pattern mask 20.

The other pattern mask 21 is provided with mask holes $21a_2$, $21a_4$, $21a_6$, and $21a_8$ arranged in a staggered manner. The mask holes $21a_2$, $21a_4$, $21a_6$, and $21a_8$ correspond to areas in respective even-numbered rows (i.e., the second, fourth, sixth, and eighth rows). Specifically, the mask holes $21a_2$ and $21a_6$ in the second and sixth rows, respectively, are formed in the same column. This column is spaced from the other column of the mask holes $21a_4$ and $21a_8$ in the fourth and eighth rows, respectively, in the conveying direction (i.e., X direction) by a distance d corresponding to one or several columns.

The mask holes $21a_2$ and $21a_6$ are opened and closed by corresponding shutters 23a arranged on the left side of the pattern mask 21. The mask holes $21a_4$ and $21a_8$ are opened and closed by corresponding shutters 23b arranged on the right side of the pattern mask 21.

In the present embodiment, in the wafer 10 that has passed through the pattern mask 21, only areas 10b in the even-numbered rows are frequency-adjusted, as indicated by shading in FIG. 7A. Then, the wafer 10 further passes through the pattern mask 20, so that areas 10c in the odd-numbered rows are frequency-adjusted, as indicated by shading in FIG. 7B. Thus, in the wafer 10 that has passed through the two pattern masks 20 and 21, the frequency adjustment for the areas 10b and 10c in all the rows has been completed. In the case of FIGS. 7A and FIG. 7B, since the pattern mask 21, as shown in FIG. 6, is positioned upstream in the wafer conveying direction, the areas 10b in the even-numbered rows are frequency-adjusted first. As will be understood, if the pattern mask 20 is positioned upstream in the wafer conveying direction, the areas 10c in the odd-numbered rows are frequency-adjusted first.

In the present embodiment, areas in one column perpendicular to the conveying direction are frequency-adjusted in four steps. Therefore, even when many very small areas are closely arranged in a wafer, adjacent shutters and actuators can be arranged without interference with each other.

As described above, the pattern masks 20 and 21 are spaced from each other by the distance D in the conveying direction. Therefore, it is possible to use actuators each having an axial length much longer than the corresponding area size. It will be understood that the number of pattern masks arranged in the conveying direction is not limited to two, but may be three or more.

The present invention is not limited to the embodiments described above, and can be variously modified. Although the above embodiments describe the cases where each area of a wafer and each mask hole of a pattern mask are both substantially square in shape, the present invention is also applicable to the case where they are both substantially rectangular in shape.

Although the above embodiments describe the cases where a plurality of elements are included in one area, the present invention is also applicable to the case where one area corresponds to one element.

Although the above embodiments describe the cases where a plurality of elements are closely formed on a wafer, the present invention is also applicable to the case where a plurality of elements are closely arranged on a tray.

Although the above embodiments describe the cases where an ion beam is applied downward in the vertical direction, the present invention is also applicable to the case where an ion beam is applied upward or horizontally.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A frequency adjusting apparatus comprising:
   a conveying unit configured to convey, in one direction, a wafer on which a plurality of elements are closely arranged;
   an ion gun for etching, the ion gun being configured to irradiate the wafer with an ion beam while the wafer is being conveyed;
   a pattern mask having a plurality of mask holes allowing only target areas of the wafer to be exposed, the pattern mask being disposed upstream of the wafer in a direction in which the ion beam travels; and
   a plurality of shutters each being configured to adjust an irradiation time during which a target area is irradiated with the ion beam, and thereby adjust a frequency in the target area,
   wherein each of the plurality of mask holes in the pattern mask corresponds to one area of the wafer;
   the plurality of mask holes being alternately displaced in a wafer conveying direction in which the wafer is conveyed, and arranged in a plurality of columns perpendicular to the wafer conveying direction;
   the shutters being arranged to correspond to the respective plurality of mask holes to individually open and close the corresponding plurality of mask holes; and
   frequency adjustment, for areas in one column perpendicular to the wafer conveying direction, being performed in multiple steps.

2. The frequency adjusting apparatus according to claim 1, wherein each of the areas of the wafer includes a plurality of elements.

3. The frequency adjusting apparatus according to claim 2, wherein the conveying unit intermittently conveys the wafer at a pitch of one area of the wafer; and
   the plurality of mask holes of the pattern mask being alternately displaced in the wafer conveying direction by a distance of one or more elements and arranged in two columns perpendicular to the wafer conveying direction.

4. The frequency adjusting apparatus according to claim 2, wherein the conveying unit intermittently conveys the wafer at a pitch of one area of the wafer; and the plurality of mask holes of the pattern mask being alternately displaced in the wafer conveying direction by a distance of one or more pitches and arranged in two columns perpendicular to the wafer conveying direction.

5. The frequency adjusting apparatus according to claim 1, wherein the conveying unit intermittently conveys the wafer at a pitch of one area of the wafer; and the plurality of mask holes of the pattern mask being alternately displaced in the wafer conveying direction by a distance of one or more elements and arranged in two columns perpendicular to the wafer conveying direction.

6. The frequency adjusting apparatus according to claim 5, wherein the shutters are divided into a first shutter group for closing the plurality of mask holes in a first column perpendicular to the wafer conveying direction and a second shutter group for closing the plurality of mask holes in a second column perpendicular to the wafer conveying direction; and first actuators configured to drive the first shutter group and second actuators configured to drive the second shutter group are arranged opposite each other on both sides of the pattern mask in the wafer conveying direction.

7. The frequency adjusting apparatus according to claim 1, wherein the conveying unit intermittently conveys the wafer at a pitch of one area of the wafer; and the plurality of mask holes of the pattern mask being alternately displaced in the wafer conveying direction by a distance of one or more pitches and arranged in two columns perpendicular to the wafer conveying direction.

8. The frequency adjusting apparatus according to claim 7, wherein the shutters are divided into a first shutter group for closing the plurality of mask holes in a first column perpendicular to the wafer conveying direction and a second shutter group for closing the plurality of mask holes in a second column perpendicular to the wafer conveying direction; and first actuators configured to drive the first shutter group and second actuators configured to drive the second shutter group being arranged opposite each other on both sides of the pattern mask in the wafer conveying direction.

9. A frequency adjusting apparatus comprising:

a conveying unit configured to convey, in one direction, a wafer on which a plurality of elements are closely arranged;

a frequency-adjusting-material applying unit configured to apply a frequency adjusting material to the wafer while the wafer is being conveyed;

a pattern mask having a plurality of mask holes allowing only target areas of the wafer to be exposed, the pattern mask being disposed upstream of the wafer in a direction in which the frequency adjusting material is applied; and a plurality of shutters, each being configured to adjust an application time during which the frequency adjusting material is applied to a target area, and thereby adjust a frequency in the target area, wherein each of the plurality of mask holes in the pattern mask corresponds to one area of the wafer;

the plurality of mask holes being alternately displaced in a wafer conveying direction in which the wafer is conveyed, and being arranged in a plurality of columns perpendicular to the wafer conveying direction;

the shutters being arranged to correspond to the respective plurality of mask holes to individually open and close the corresponding plurality of mask holes; and frequency adjustment, for areas in one column perpendicular to the wafer conveying direction, being performed in multiple steps.

10. The frequency adjusting apparatus according to claim 9, wherein each of the areas of the wafer includes a plurality of elements.

11. The frequency adjusting apparatus according to claim 10, wherein the conveying unit intermittently conveys the wafer at a pitch of one area of the wafer; and the plurality of mask holes of the pattern mask being alternately displaced in the wafer conveying direction by a distance of one or more elements and arranged in two columns perpendicular to the wafer conveying direction.

12. The frequency adjusting apparatus according to claim 10, wherein the conveying unit intermittently conveys the wafer at a pitch of one area of the wafer; and the plurality of mask holes of the pattern mask being alternately displaced in the wafer conveying direction by a distance of one or more pitches and arranged in two columns perpendicular to the wafer conveying direction.

13. The frequency adjusting apparatus according to claim 9, wherein the conveying unit intermittently conveys the wafer at a pitch of one area of the wafer; and the plurality of mask holes of the pattern mask being alternately displaced in the wafer conveying direction by a distance of one or more elements and arranged in two columns perpendicular to the wafer conveying direction.

14. The frequency adjusting apparatus according to claim 13, wherein the shutters are divided into a first shutter group for closing the plurality of mask holes in a first column perpendicular to the wafer conveying direction and a second shutter group for closing the plurality of mask holes in a second column perpendicular to the wafer conveying direction; and first actuators configured to drive the first shutter group and second actuators configured to drive the second shutter group being arranged opposite each other on both sides of the pattern mask in the wafer conveying direction.

15. The frequency adjusting apparatus according to claim 9, wherein the conveying unit intermittently conveys the wafer at a pitch of one area of the wafer; and the plurality of mask holes of the pattern mask being alternately displaced in the wafer conveying direction by a distance of one or more pitches and arranged in two columns perpendicular to the wafer conveying direction.

16. The frequency adjusting apparatus according to claim 15, wherein the shutters are divided into a first shutter group for closing the plurality of mask holes in a first column perpendicular to the wafer conveying direction and a second shutter group for closing the plurality of mask holes in a second column perpendicular to the wafer conveying direction; and first actuators configured to drive the first shutter group and second actuators configured to drive the second shutter group being arranged opposite each other on both sides of the pattern mask in the wafer conveying direction.

* * * * *